(12) United States Patent
Oh et al.

(10) Patent No.: US 7,180,188 B2
(45) Date of Patent: Feb. 20, 2007

(54) CONTACT STRUCTURE OF SEMICONDUCTOR DEVICES AND METHOD OF FABRICATING THE SAME

(75) Inventors: Jung-Hwan Oh, Incheon-si (KR); Byung-Lyul Park, Seoul (KR); Hong-Seong Son, Suwon-si (KR)

(73) Assignee: Samsung Electronics, Oo., ltd., Suwon-si (KR)

( * ) Notice: Subject to any disclaimer, the term of this patent is extended or adjusted under 35 U.S.C. 154(b) by 142 days.

(21) Appl. No.: 10/833,548

(22) Filed: Apr. 28, 2004

(65) Prior Publication Data

US 2004/0224498 A1 Nov. 11, 2004

(30) Foreign Application Priority Data

May 7, 2003 (KR) .................. 10-2003-0029002

(51) Int. Cl.
*H01L 23/48* (2006.01)

(52) U.S. Cl. .................. 257/750; 257/752; 257/753

(58) Field of Classification Search ............... 257/750, 257/752, 753
See application file for complete search history.

(56) References Cited

U.S. PATENT DOCUMENTS 6,548,410 B2 * 4/2003 Kwon .................. 438/694
6,607,977 B1 * 8/2003 Rozbicki et al. ........... 438/627

FOREIGN PATENT DOCUMENTS

JP 09186158 7/1997

* cited by examiner

*Primary Examiner*—Doug Menz
(74) *Attorney, Agent, or Firm*—F. Chau & Associates, LLC

(57) ABSTRACT

A contact structure includes a lower conductive pattern disposed on a predetermined region of a semiconductor substrate. The lower conductive layer has a concave region at a predetermined region of a top surface thereof. An embedding conductive layer fills the concave region. The top surface of the embedding conductive layer is placed at least as high as the height of the flat top surface of the lower conductive pattern. A mold layer is disposed to cover the semiconductor substrate, the lower conductive pattern and the embedding conductive layer. An upper conductive pattern is arranged in an intaglio pattern. The intaglio pattern is disposed in the mold layer to expose a predetermined region of the embedding conductive layer.

8 Claims, 7 Drawing Sheets

CONTACT STRUCTURE OF SEMICONDUCTOR DEVICES AND METHOD OF FABRICATING THE SAME

BACKGROUND

1. Technical Field

The present disclosure relates to semiconductor devices and methods of fabricating the same and, more particularly, to a contact structure of semiconductor devices and methods of fabricating the same.

2. Discussion of Related Art

Generally, interconnections of semiconductor devices may be formed in a stacking-structure, which is advantageous to high-intensity devices. Interlayer dielectric layers are formed between multi-layer interconnections, which are stacked vertically. Each interlayer dielectric layer insulates corresponding lower and upper interconnections. The lower and upper interconnections may be electrically connected to each other depending on the application. The lower and upper interconnections are electrically connected to each other using a contact technique, in which a contact hole penetrating the interlayer dielectric layer is disposed between the lower and upper interconnections. A contact plug or a portion of the upper interconnection may be filled in the contact hole.

As semiconductor devices become more highly integrated, the line width of interconnections and the diameter of contact holes are reduced. Therefore, operation speeds of semiconductor devices are decreased due to increasing resistances of the interconnections or a contact resistance between the lower and upper interconnections. Presently, there is much research being conducted to solve theses problems.

Aluminum is commonly used to form interconnects. Recently, copper interconnections have been suggested to reduce resistances of the interconnections because they have a lower resistivity value in comparison with aluminum interconnections.

FIG. 1 through FIG. 3 are cross-sectional views illustrating a method for fabricating semiconductor devices having a conventional copper interconnection.

Referring to FIG. 1, a lower interlayer dielectric layer 2 is formed on a semiconductor substrate 1. A lower interconnection 3 is formed in the lower interlayer dielectric layer 2. The lower interlayer dielectric layer 2 is formed of silicon oxide and the lower interconnection 3 is formed of copper. The lower interconnection 3 is formed in a groove in the lower interlayer dielectric layer 2. A barrier layer (not shown) can be disposed between the lower interconnection 3 and the lower interlayer dielectric layer 2. A silicon nitride layer 4 and an upper interlayer dielectric layer 5 are sequentially formed on the entire surface of the semiconductor substrate 1 including the lower interconnection 3.

The upper interlayer dielectric layer 5 and the silicon nitride layer 4 are successively patterned to form a contact hole 6 exposing a predetermined region of the lower interconnection 3. A high-resistance copper compound 7 may be formed on the lower interconnection 3 exposed at the contact hole 6. The high-resistance copper compound 7 can be formed by native oxidizing the exposed lower interconnection 3. Accordingly, the high-resistance copper compound 7 can be isotropically formed from a surface of the lower interconnection 3 exposed at the contact hole 6. As a result, the top area of the high-resistance copper compound 7 is larger than an area exposed by the contact hole 6. Furthermore, the high-resistance copper compound 7 may further include an etching by-product. The etching by-product may be formed during formation of the contact hole 6.

Referring to FIG. 2 and FIG. 3, contact resistance is increased due to the high-resistance copper compound 7. Therefore, the high-resistance copper compound 7 is completely removed by performing a post-treatment process at the semiconductor substrate 1 including the high-resistance copper compound 7. As a result, a concave region 8 is formed in position of the high-resistance copper compound 7. Depending on the configuration of the high-resistance copper compound 7, edges of the concave region 8 can be placed under the silicon nitride layer 4.

A contact plug 9 filling the contact hole 6 is formed. The contact plug 9 may be formed of a stacked barrier layer (not shown) and a copper layer. At this time, a void 10 may occur at the edge of the concave region 8 placed under the silicon nitride layer 4. Therefore, the contact plug 9 may not completely fill the concave region 8.

Consequently, resistance between the contact plug 9 and the lower interconnection 3 is increased due to the void 10. Furthermore, reliability of semiconductor devices having the void 10 is degraded.

SUMMARY OF THE INVENTION

A contact structure of a semiconductor device according to an embodiment of the invention includes a lower conductive pattern disposed at predetermined region of a semiconductor substrate. A concave region is formed at predetermined region of a top surface of the lower conductive pattern. An embedding conductive layer is filled in the concave region. A top surface of the embedding conductive layer is placed at least as high as a top surface of the lower conductive pattern. A mold layer covers the semiconductor substrate, the lower conductive pattern and the embedding conductive layer. An upper conductive pattern is disposed in an intaglio pattern. The intaglio pattern is disposed in the mold layer to expose a predetermined region of the embedding conductive layer.

Preferably, the embedding conductive layer is made of metals formed by performing an electroless plating method. The embedding conductive layer may be formed of at least one metal selected from the group consisting of copper, cobalt, palladium and nickel. The contact structure may further include a capping layer between the mold layer and the lower conductive pattern. The lower conductive pattern may include a barrier pattern and a metal pattern. The barrier pattern is conformally disposed on the top surface of the exposed embedding conductive layer and on an inner sidewall of the intaglio pattern, and the metal pattern is disposed so as to fill the intaglio pattern on the barrier pattern. The upper conductive pattern may be filled in a contact hole that penetrates the mold layer to expose a predetermined region of the embedding conductive layer. The contact hole corresponds to the intaglio pattern. Alternatively, the mold layer may include first and second interlayer dielectrics, which are stacked sequentially. The upper conductive pattern may be filled in a contact hole and a groove. The contact hole penetrates the first interlayer dielectric to expose a predetermined region of the embedding conductive layer and the groove is disposed in the second interlayer dielectric in communication with the contact hole. The contact hole in the first interlayer dielectric and the groove in the second interlayer dielectric compose the intaglio pattern.

A method of fabricating a contact structure of a semiconductor device according to an embodiment of the invention includes a step of forming a lower conductive pattern at a predetermined region of a semiconductor substrate. A mold layer is formed over the semiconductor substrate including the lower conductive pattern. The mold layer is patterned to form an intaglio pattern exposing a predetermined region of the lower conductive pattern. A concave region is formed at a predetermined region of a top surface of the lower conductive pattern by performing a post-treatment process at the semiconductor substrate including the intaglio pattern. An embedding conductive layer is formed to fill the concave region, wherein the top surface of the embedding conductive layer is placed as high as a top surface of the lower conductive pattern. An upper conductive pattern is formed to fill the intaglio pattern.

In at least one embodiment of the invention, the method includes a step of forming a capping layer on a surface of the semiconductor substrate including the lower conductive pattern before forming the mold layer. The intaglio pattern may be formed of a contact hole that penetrates the mold layer to expose the predetermined region of the lower conductive pattern. Alternatively, the step of forming the mold layer and the intaglio pattern may include the steps of forming a first interlayer dielectric covering the bottom conductive pattern and the semiconductor substrate, forming a second interlayer dielectric over the first interlayer dielectric, and forming a contact hole and a groove. The contact hole penetrates the first interlayer dielectric to expose the predetermined region of the lower conductive pattern, and the groove is formed in communication with the contact hole in the second interlayer dielectric. The post-treatment process may be performed using at least one liquid chemical selected from the group consisting of a liquid chemical including tetra-methyl-ammonium-hydroxide (TMAH), a liquid chemical including chlorine, a liquid chemical including a carboxyl group and a liquid chemical including ascorbic acid. The post-treatment process may be an isotropic etching method. Preferably, the embedding conductive layer is formed using an electroless plating method. The embedding conductive layer may be formed of at least one metal selected from the group consisting of copper, cobalt, palladium and nickel. The step of forming the upper conductive pattern includes the steps of forming a conformal barrier layer on a surface of the semiconductor substrate including the embedding conductive layer, forming a metal layer filling the intaglio pattern on the barrier layer, and forming a barrier pattern and a metal pattern by planarizing the metal layer and the barrier layer until the top surface of the mold layer is exposed. The method may further include a step of recessing the top surface of the embedding conductive layer exposed at the intaglio pattern, before forming the barrier layer.

A contact structure of a semiconductor device according to an embodiment of the invention is fabricated by a method including the steps of forming a lower conductive pattern over a predetermined region of a semiconductor substrate, forming a mold layer over the semiconductor substrate including the lower conductive pattern, and forming an intaglio pattern by patterning the mold layer, wherein the intaglio pattern exposes a predetermined region of the lower conductive pattern. A concave region is formed at a predetermined region of a top surface of the lower conductive pattern by performing a post-treatment process at the semiconductor substrate including the intaglio pattern. An embedding conductive layer is formed so as to fill the concave region. A top surface of the embedding conductive layer is disposed at least as high as the height of the top surface of the lower conductive pattern. An upper conductive pattern is formed so as to fill the intaglio pattern.

BRIEF DESCRIPTION OF THE DRAWINGS

Exemplary embodiments of the present invention will be described in detail with reference to the attached drawings in which.

DESCRIPTION OF PREFERRED EMBODIMENTS

Reference will now be made in detail to preferred embodiments of the present invention, examples of which are illustrated in the accompanying drawings. However, the present invention is not limited to the embodiments illustrated herein after, and the embodiments herein are introduced to provide easy and complete understanding of the scope and spirit of the present invention.

Figure 1:
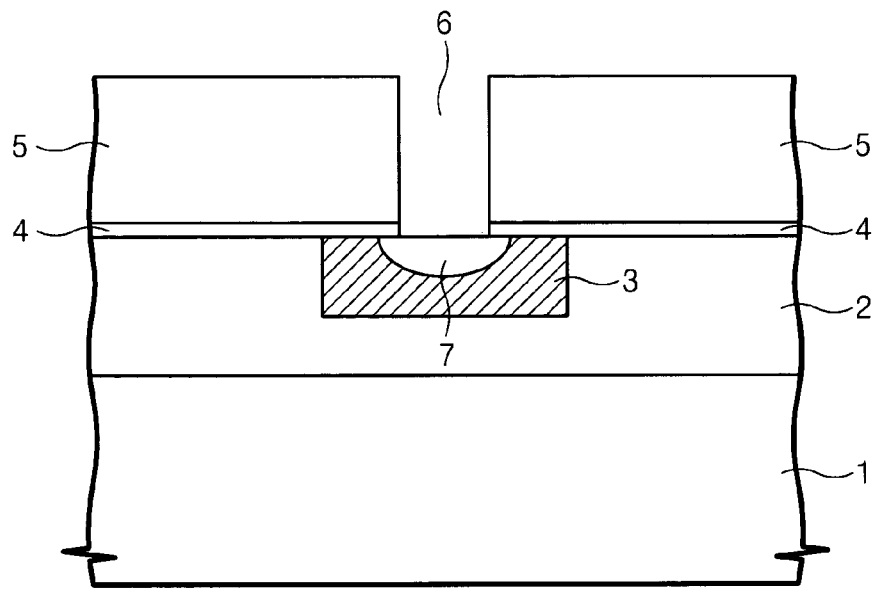
FIG. 1 through FIG. 3 are cross-sectional views illustrating a conventional method for fabricating a semiconductor device.
Figure 2:
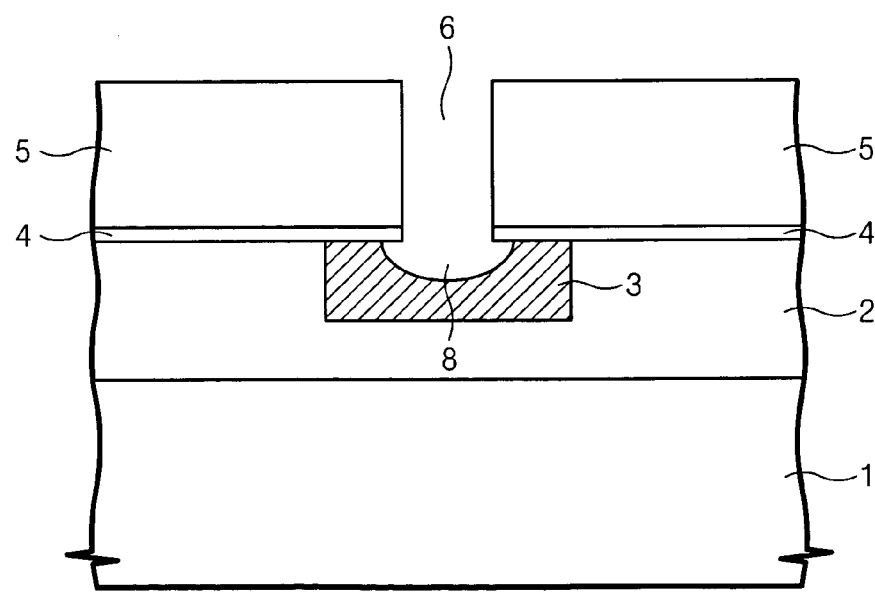
Figure 3:
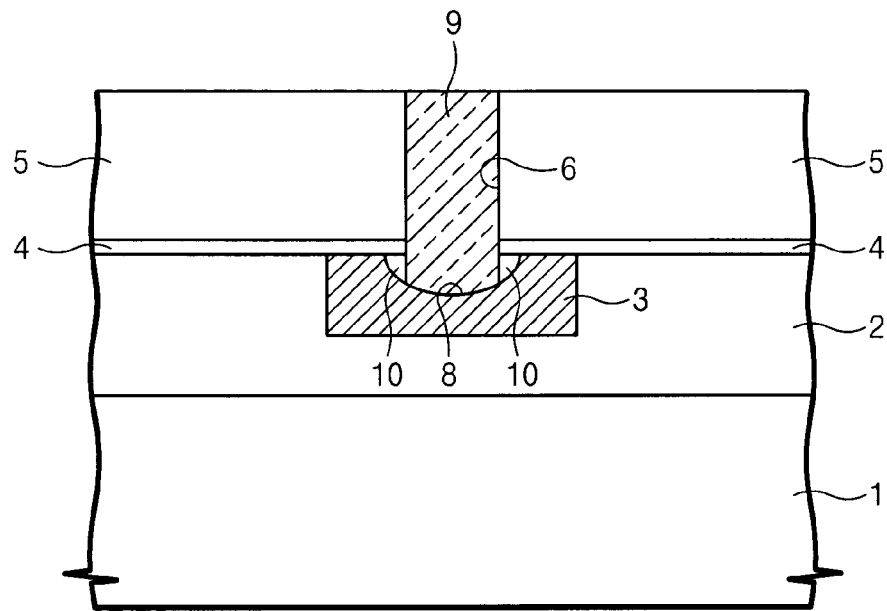
Figure 4:
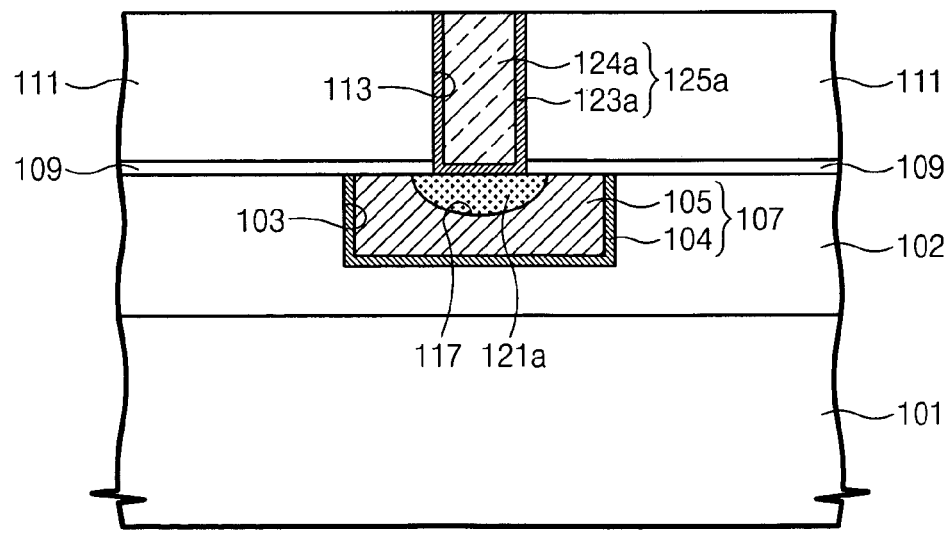
FIG. 4 is a cross-sectional view showing a contact structure of a semiconductor device according to an embodiment of the present invention.

FIG. 4 is a cross-sectional view showing a contact structure of a semiconductor device according to an embodiment of the present invention.

Referring to FIG. 4, a lower interconnection 107 is arranged over a semiconductor substrate 101. The lower interconnection 107 may be arranged in a lower interlayer dielectric 102 formed on the semiconductor substrate 101. The lower interconnection 107 may be arranged in a groove 103 formed in the lower interlayer dielectric 102. The lower interconnection 107 may comprise a first barrier pattern 104 and a first metal pattern 105, which are sequentially stacked in the groove 103. The first metal pattern 105 may be formed of copper. It is preferable that the first barrier pattern 104 is formed of a conductive material that prevents metal elements in the first metal pattern 105 from diffusing into the lower interlayer dielectric 102. For example, the first barrier pattern 104 may be formed of TiN, Ti/TiN, TaN or Ta/TaN.

In other exemplary embodiments of the invention, the lower interconnection 107 may be arranged on the lower interlayer dielectric 102. The lower interlayer dielectric 102 may be formed of a silicon oxide layer. Alternatively, the lower interlayer dielectric 102 may be formed of a fluorine doped silicate glass (FSG) layer or a SiOC layer, which have a lower dielectric constant than that of a silicon oxide layer.

The lower interconnection 107 has a concave region 117 at a predetermined region of the top surface of the lower interconnection 107. An embedding conductive layer 121a fills the concave region 117. The top surface of the embedding conductive layer 121a is placed at least as high as the flat top surface of the bottom interconnection 107. The embedding conductive layer 121a is preferably a metal formed using an electroless plating method. Preferably, the embedding conductive layer 121a is formed of at least one material selected from the group consisting of copper, palladium, nickel and cobalt. The top surface of the embedding conductive layer 121 may be recessed.

A capping layer 109 covers the bottom interconnection 107, the embedding conductive layer 121a and the bottom interlayer dielectric 102. A mold layer 111 is arranged on the capping layer 109. The capping layer 109 prevents metal elements in the lower interconnection 107 from diffusing into the mold layer 111. In addition, the capping layer 109 may be formed of an insulation layer having an etch selectivity with respect to the mold layer 111. For instance, the capping layer 109 may be formed of a silicon nitride layer, a silicon oxy-nitride layer or a silicon carbonate (SiC) layer. The mold layer 111 may be formed of a silicon oxide layer, an FSG layer or an SiOC layer.

A contact hole 113 successively penetrates the mold layer 111 and the capping layer 109 to expose a predetermined region of the embedding conductive layer 121a. An upper conductive pattern 125a fills the contact hole 113. The upper conductive pattern 125a is contact plug-shaped and the contact hole 113 corresponds to an intaglio pattern. Preferably, the upper conductive pattern 125a is composed of a second barrier pattern 123a and a second metal pattern 124a, which are sequentially stacked in the contact hole 113. The second barrier pattern 123a is conformally arranged on sidewalls of the contact hole 113 and on the top surface of the exposed embedding conductive layer 121a. The second metal pattern 124a fills the contact hole 113. The second metal pattern 124a may be formed of copper or aluminum. The second barrier pattern 123a may be formed of a conductive layer that prevents metal elements in the second metal pattern 124a from diffusing into the mold layer 111. The second barrier pattern 123a may be made of TiN, Ti/TiN, TaN or Ta/TaN.

In the contact structure according to the present embodiment of the invention, the concave region 117 under the contact hole 113 is filled with the embedding conductive layer 121a. Accordingly, occurrence of voids can be prevented. Therefore, the contact structure has a relatively low contact resistance as compared to that of the conventional art. In addition, reliability degradation of the semiconductor device having the contact structure according to the present embodiment of the invention can be prevented.

FIG. 5 through FIG. 8 are cross-sectional views illustrating a method for fabricating a contact structure of a semiconductor device according to an embodiment of the invention.

Figure 5:
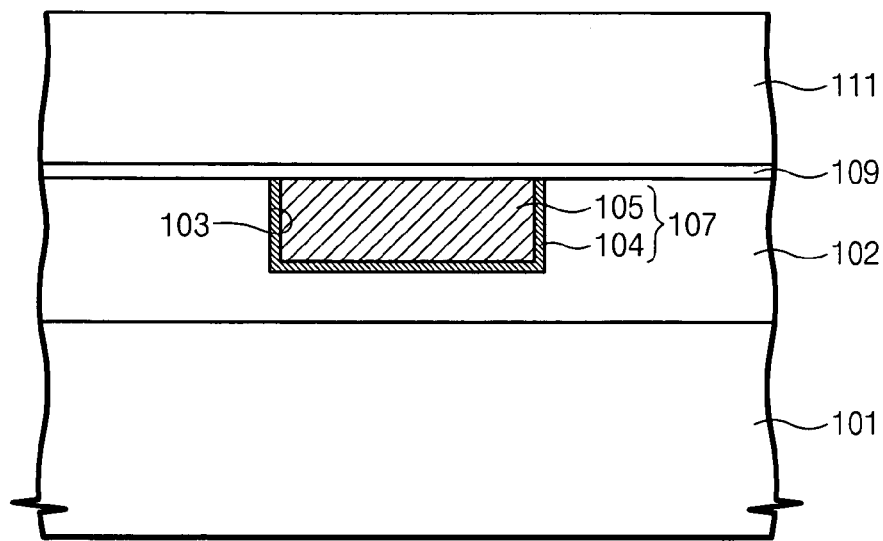
FIG. 5 through FIG. 8 are cross-sectional views illustrating a method for fabricating a contact structure of a semiconductor device according to an embodiment of the invention.

Referring to FIG. 5, a lower interlayer dielectric 102 is formed on a semiconductor substrate 101. The lower interlayer dielectric 102 may be formed of, for example, a silicon oxide layer, a FSG layer or a SiOC layer. The lower interlayer dielectric 102 is patterned to form a groove 103. A lower interconnection 107 is formed in the groove 103.

The lower interconnection 107 is fabricated by forming a first barrier layer (not shown) conformally on the semiconductor substrate 101 including the groove 103. A first metal layer (not shown) filling the groove 103 is formed on the first barrier layer. Then, the first metal layer and the first barrier layer are planarized until the top surface of the lower interlayer dielectric 102 is exposed to form a first barrier pattern 104 and a first metal pattern 105 stacked in the order named. The first barrier pattern 104 and the first metal pattern 105 compose the lower interconnection 107. Alternatively, the lower interconnection 107 may be formed on the lower interlayer dielectric 102.

The first barrier pattern 104 may be formed of a conductive layer that prevents metal elements in the metal pattern 105 from diffusing into the lower interlayer dielectric 102. For example, the first barrier pattern 104 may be formed of TiN, Ti/TiN, TaN or Ta/TaN.

A capping layer 109 and a mold layer 11 are sequentially formed on the entire surface of the semiconductor substrate 101 including the lower interconnection 107. The capping layer 109 may be formed of an insulation layer that prevents metal elements in the lower interconnection 107 from diffusing into the mold layer 111. Additionally, the capping layer 109 may be formed of an insulation layer having an etch selectivity with respect to the mold layer 111. For example, the capping layer 109 may be formed of a silicon nitride layer, a silicon oxy-nitride layer or a silicon carbonate layer. The mold layer 111 may be formed of, for example, a silicon oxide layer, an FSG layer or a SiOC layer.

Figure 6:
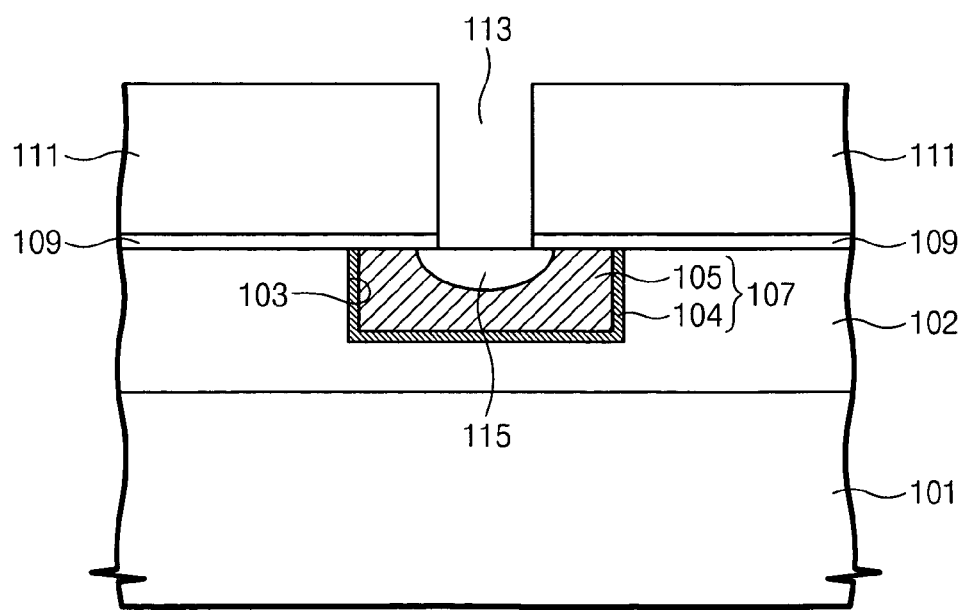
Figure 7:
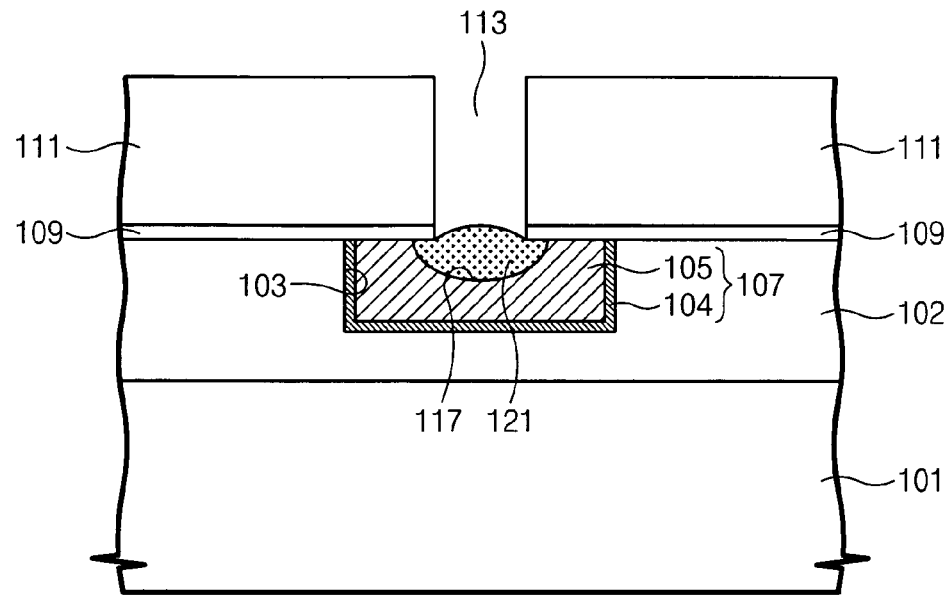

Referring to FIG. 6 and FIG. 7, the mold layer 111 and the capping layer 109 are successively patterned to form a contact hole 113 exposing a predetermined region of the lower interconnection 107. At this time, a high-resistance compound 115 may be formed at the exposed region of the lower interconnection 107. The top surface of the high-resistance compound 115 may be wider than an area of the lower interconnection 107 exposed by the contact hole 113.

The high-resistance compound 115 is removed by performing a post-treatment process at the semiconductor substrate 101 including the contact hole 113, so that a concave region 117 is formed in the lower interconnection 107. The edge of the concave region 117 may be placed under the capping layer 105. Preferably, the post-treatment process is an isotropic etching process. A liquid chemical is preferably used in the post-treatment process to etch the high-resistance compound 115 faster than the mold layer 111. The post-treatment process may be performed using at least one selected from the group consisting of a liquid chemical including tetra-methyl-ammonium-hydroxide (TMAH), a liquid chemical including chlorine, a liquid chemical including a carboxyl group and a liquid chemical including ascorbic acid.

An embedding conductive layer 121 is formed to fill the concave region 117. Preferably, the embedding conductive layer 121 is made of a metal formed by an electroless plating method. The electroless plating method includes reducing metal ions to metal by the action of chemical reducing agents in metal indigo aqueous solution without providing external electrical energy, so that the metal layer formed by the electroless plating method is formed at random (isotropic). In addition, the metal layer formed by the electroless plating method may be selectively formed on another metal layer. The embedding conductive layer 121 sufficiently filling the concave region 117 can be formed by exposing the semiconductor substrate 101 in the metal indigo aqueous solution including the predetermined catalyst. At this time, due to the isotropy of the electroless plating method, the embedding conductive layer 121 sufficiently fills edges of the concave region 117 under the capping layer 109. Also, because of the selectivity of the electroless plating method, the embedding conductive layer 121 is selectively formed at the bottom of the concave region 117. The embedding conductive layer 121 may be formed of at least one selected from the group consisting of copper, nickel, cobalt and palladium. The top surface of the embedding conductive layer 121 is placed as high as the flat top surface of the lower interconnection 107. That is, the embedding conductive layer 121 may fill a portion of the contact hole 113.

Figure 8:
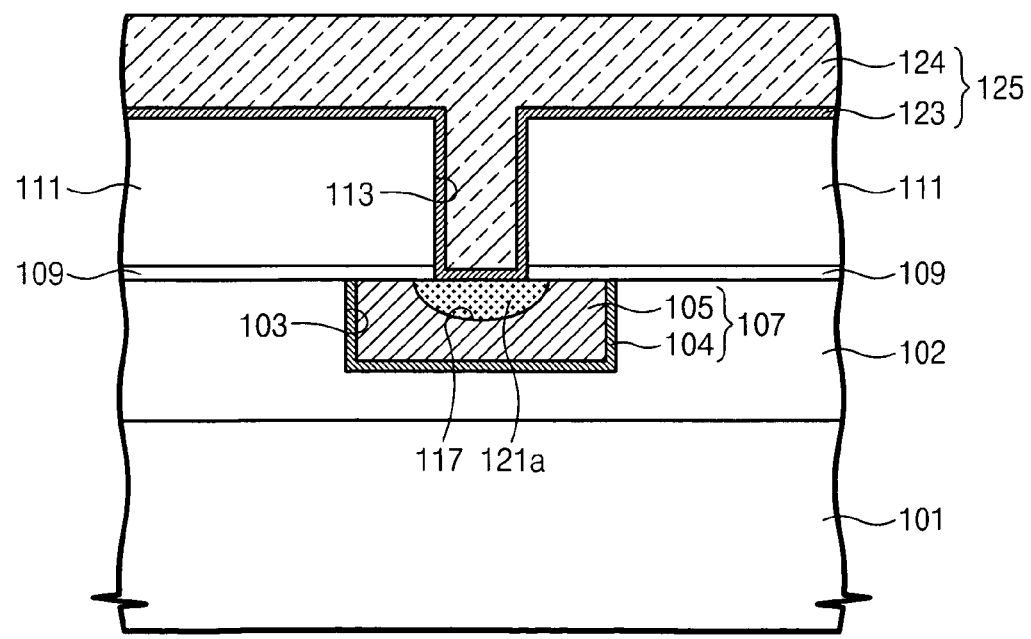

Referring to FIG. 8, the top surface of the embedding conductive layer 121 may be recessed by performing a recessing process in which the top surface of the embedding conductive layer 121 is planarized. The top surface of the recessed embedding conductive layer 121a may be formed at least as high as the height of the flat portion of the bottom interconnection 107. That is, the recessing process planarizes a portion of the embedding conductive layer 121 formed outside of the concave region 117. The recessing process may be carried out using, for example, a RF (radio frequency) plasma etching process. Alternatively, in other embodiments of the invention, the recessing process may be omitted.

A conductive layer 125, which fills the contact hole 113, is formed on the entire surface of the semiconductor substrate 101. At this time, since the concave region 117 is completely filled with the recessed embedding conductive layer 121a, the conductive layer 125 is formed on the recessed embedding conductive layer 121a. The recessing process may be performed in-situ in an apparatus for forming the conductive layer 125.

Preferably, the conductive layer 125 includes a second barrier layer 123 and a second metal layer 124. The second metal layer 124 is formed to fill the contact hole 113 on the second barrier layer 123. The second barrier layer 123 may be formed of a conductive layer that prevents metal elements in the second metal layer 124 from diffusing into the mold layer 111. The second barrier layer 123 may be made of, for example, TiN, Ti/TiN, TaN or Ta/TaN, and the second metal layer 124 may be formed of, for example, copper or aluminum.

The conductive layer 125 is planarized until the top surface of the mold layer 111 is exposed to form an upper conductive pattern, such as the upper conductive pattern 125a of FIG. 4. The upper conductive pattern includes a second barrier pattern and a second metal pattern, which are stacked sequentially. The planarizing process can be performed using, for example, a chemical mechanical polishing (CMP) process.

In the fabricating method of the contact structure according to the present embodiment of the invention, the concave region 117 is completely filled with the embedding conductive layer 124, thereby preventing the occurrence of voids. Consequently, contact resistance of the contact structure is decreased and reliability of semiconductor devices having the contact structure is improved.

Figure 9:
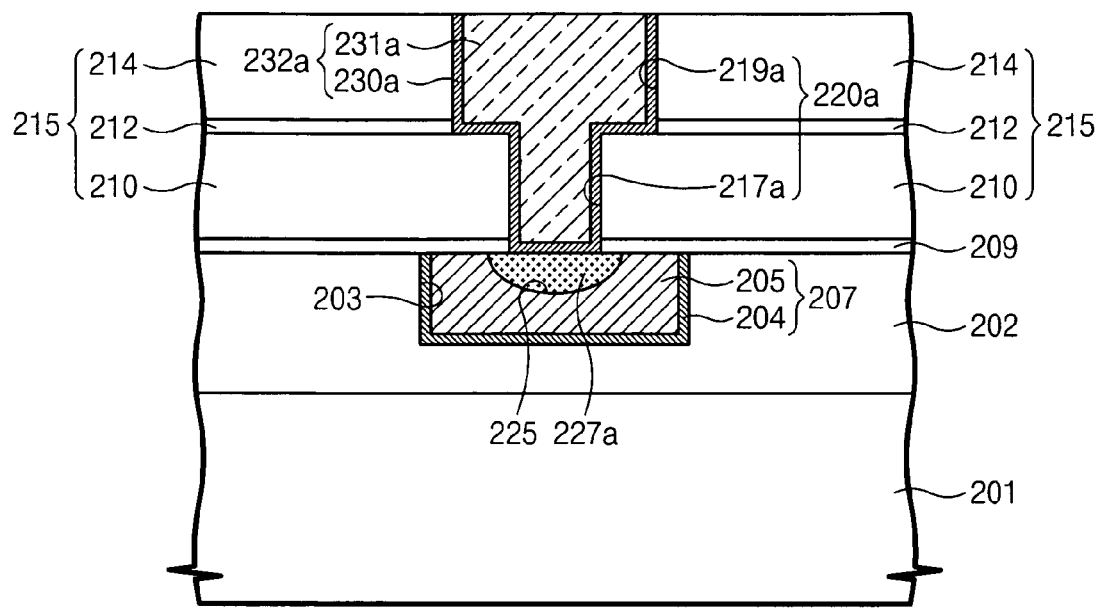
FIG. 9 is cross-sectional view showing a contact structure of a semiconductor device according to another embodiment of the present invention.

FIG. 9 is a cross-sectional view showing the contact structure of a semiconductor device according to another embodiment of the present invention.

Referring to FIG. 9, a lower interconnection 207 is disposed on a semiconductor substrate 201. The lower interconnection 207 can be disposed in a first groove 203. The first groove 203 is disposed in a lower interlayer dielectric 202 formed on the semiconductor substrate 201. Alternatively, in other embodiments of the invention, the lower interconnection 207 may be disposed on the lower interlayer dielectric 202. The lower interconnection 207 may include a first barrier pattern 204 and a first metal pattern 205. The first barrier pattern 204 is conformally formed on inner sidewalls and the bottom of the first groove 203. The first metal pattern 205 is disposed on the first barrier 204 to fill the first groove 203. The first barrier pattern 204 may be formed of a conductive layer that prevents metal elements in the first metal pattern 205 from diffusing into the lower interlayer dielectric 202. The first barrier pattern 204 may be made of, for example, TiN, Ti/TiN, TaN or Ta/TaN, and the first metal pattern 205 may be made of, for example, copper. The lower interlayer dielectric 202 may be formed of, for example, a silicon oxide layer, an FSG layer or a SiOC layer.

A concave region 225 is arranged at a predetermined region at the top surface of the lower interconnection 207. An embedding conductive layer 227a is filled in the concave region 225. The top surface of the embedding conductive layer 227a is disposed at least as high as the flat top surface of the lower interconnection 207. The embedding conductive layer 227a may be formed of metals that are formed by electroless plating method. For example, the embedding conductive layer 227a may be formed of at least one selected from the group consisting of copper, palladium, nickel and cobalt. The top surface of the embedding conductive layer 227a may be recessed.

A capping layer 209 is disposed on the semiconductor substrate 201 to cover the lower interconnection 207, the embedding conductive layer 227a and the lower interlayer dielectric 202. The capping layer 209 may be formed of, for example, a silicon-nitride layer, a silicon oxy-nitride layer and a silicon-carbonate layer.

A mold layer 215 is disposed on the capping layer 209. The mold layer 215 may include a first interlayer dielectric 210, an etching stop layer 212 and a second interlayer dielectric 214, which are sequentially stacked. The first and second interlayer dielectrics 210 and 214 may be formed of, for example, a silicon oxide layer, an FSG layer or a SiOC layer. The etch stop layer 212 may be made of, for example, a silicon-nitride layer, a silicon oxy-nitride layer or a silicon-carbonate layer. Alternatively, if the etching stop layer 212 is omitted, the second interlayer dielectric 214 may have an etch selectivity with respect to the first interlayer dielectric 210.

An intaglio pattern 220a is disposed in the mold layer 215 and the capping layer 209 and exposes a predetermined region of the embedding conductive layer 227a. Preferably, the intaglio pattern 227a includes a contact hole 217a and a second groove 219a. The contact hole 217a penetrates the first interlayer dielectric 210 and the capping layer 209 to expose the predetermined region of the embedding conductive layer 227a. The second groove 219a is formed in the second interlayer dielectric 214 and the etching stop layer 212. The contact hole 217a is in communication with the second groove 219a.

An upper conductive pattern 232a fills the intaglio pattern 220a. The embedding conductive layer 227a completely fill the concave region 225, and the upper conductive pattern 232a is disposed on the exposed embedding conductive layer 227a. Preferably, the upper conductive pattern 232a includes a second barrier pattern 230a and a second metal pattern 231a. The second barrier pattern 230a is conformally arranged on inner sidewalls of the intaglio pattern 220a and on the exposed surface of the embedding conductive layer 227a. The second metal pattern 231a is disposed on the second barrier pattern 230aand fills the intaglio pattern 220a. The second barrier pattern 230a may be formed of a conductive layer that prevents metal elements in the second metal pattern 231 a from diffusing in the mold layer 215. The second barrier pattern 230a may be made of, for example, TiN, Ti/TiN, TaN or Ta/TaN, and the second metal pattern 231a may be made of, for example, copper or aluminum.

In the contact structure according to the present embodiment of the invention, the concave region 225 at the top surface of the lower interconnection 207 is sufficiently filled with the embedding conductive layer 227a, thereby preventing the occurrence of voids. Consequently, contact resistance of the contact structure is decreased, and reliability degradation of semiconductor devices having the contact structure is prevented.

FIG. 10 through FIG. 13 are cross-sectional views illustrating a method of fabricating a contact structure of a semiconductor device according to another embodiment of the invention.

Figure 10:
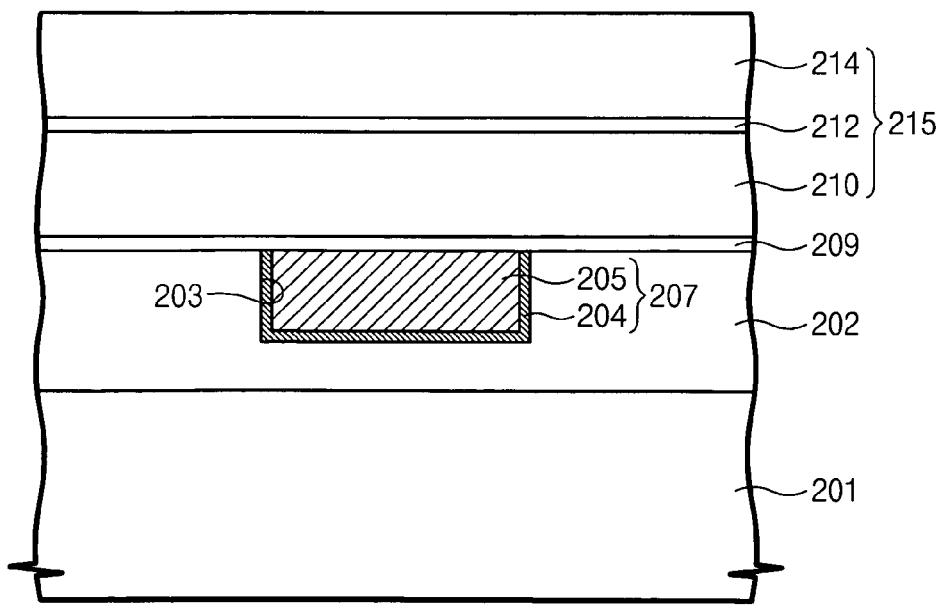
FIG. 10 through FIG. 13 are cross-sectional views illustrating a method for fabricating a contact structure of a semiconductor device according to another embodiment of the invention.

Referring to FIG. 10, a lower interlayer dielectric 202 is formed on a semiconductor substrate 201. The lower interlayer dielectric 202 is patterned to form a first groove 203. The lower interlayer dielectric 202 may be formed of, for example, a silicon oxide layer, an FSG layer or a SiOC layer. A lower interconnection 207 filling the first groove 203 is formed. The lower interconnection 207 may include a first barrier pattern 204 and a first metal pattern 205. The first barrier pattern 204 is formed conformally in the first groove 203, and the first metal pattern 205 is disposed on the first barrier pattern 204 to fill the first groove 203. The lower interconnection 207 may be formed in the same manner as that described for previous embodiments of the invention. Alternatively, the lower interconnection 207 may be formed on the lower interlayer dielectric 202. The first barrier pattern 204 may be formed of, for example, TiN, Ti/TiN, TaN or Ta/TaN. The first metal pattern 204 may be formed of, for example, copper.

A capping layer 209 and a mold layer 215 are sequentially formed on the entire surface of the semiconductor substrate 201. Preferably, the mold layer 215 includes a first interlayer dielectric 210, an etching stop layer 212 and a second interlayer dielectric 214 which are stacked in the order named. The capping layer 209 may be formed of an insulation layer that prevents metal elements in the lower interconnection 207 from diffusing into the mold layer 215. Furthermore, the capping layer 209 may have an etch selectivity with respect to the first interlayer dielectric 210. For example, the capping layer 209 may be formed of a silicon nitride layer, a silicon oxy-nitride layer or a silicon carbonate layer. The first and second interlayer dielectrics 210 and 214 may be formed of, for example, a silicon oxide layer, an FSG layer or a SiOC layer. The etching stop layer 212 may be formed of an insulation layer having an etching selectivity with respect to the second interlayer dielectric 214, such as, for example, a silicon nitride layer, a silicon oxy-nitride layer or a silicon carbonate layer. The capping layer 209 and the etching stop layer 212 may be formed of insulation layers having the same etching selectivity. For example, the capping layer 209 and the etching stop layer 212 may be formed of the same materials.

Figure 11:
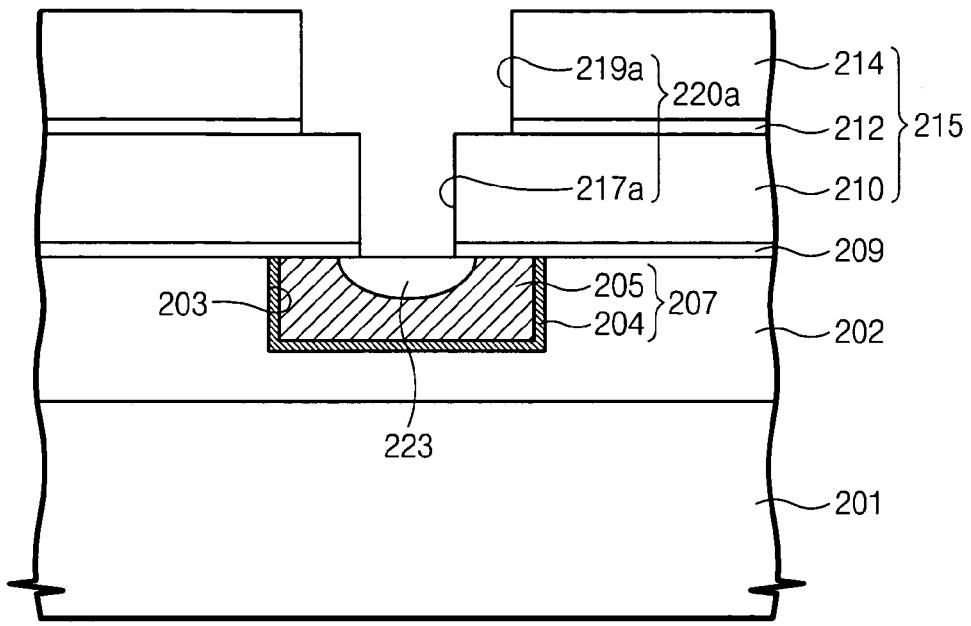

Referring to FIG. 11, the mold layer 215 and the capping layer 209 are patterned to form a contact hole 217a and a second groove 219a. The contact hole 217a and the second groove 219a compose an intaglio pattern 220a. The contact hole 217a penetrates the first interlayer dielectric 210 and the capping layer 209 to expose a predetermined region of the lower interconnection 207, and the second groove 219a is formed in the second interlayer dielectric 214 and the etching stop layer 212 to communicate with the contact hole 217a.

The intaglio pattern 220a is formed by successively patterning the mold layer 215 and the capping layer 209 to form the contact hole 217a exposing a predetermined region of the lower interconnection 207. Then, the second interlayer dielectric 214 and the etching stop layer 212 are successively patterned to form the second groove 219a in communication with the contact hole 217a. The mold layer 215 may be patterned to form a preliminary contact hole (not shown) exposing the capping layer 209 disposed on a predetermined region of the lower interconnection 207. The second interlayer dielectric 214 may be patterned to form a preliminary groove (not shown). The preliminary groove is formed over the preliminary contact hole and exposes a predetermined region of the etching stop layer 212. The exposed capping layer 209 and the exposed etching stop layer 212 are removed simultaneously to form the contact hole 217a and the second groove 219a.

Alternatively, the contact hole 217a may be formed after forming the second groove 219a. That is, the second interlayer dielectric 214 and the etching stop layer 212 are successively patterned to form the second groove 219a exposing a predetermined region of the first interlayer dielectric 210. The exposed first interlayer dielectric 210 and capping layer 209 are successively patterned to form the contact hole 217a exposing a predetermined region of the lower interconnection 207. In this case, the capping layer 209 and the etching stop layer 212 may be etched at the same time.

Figure 12:
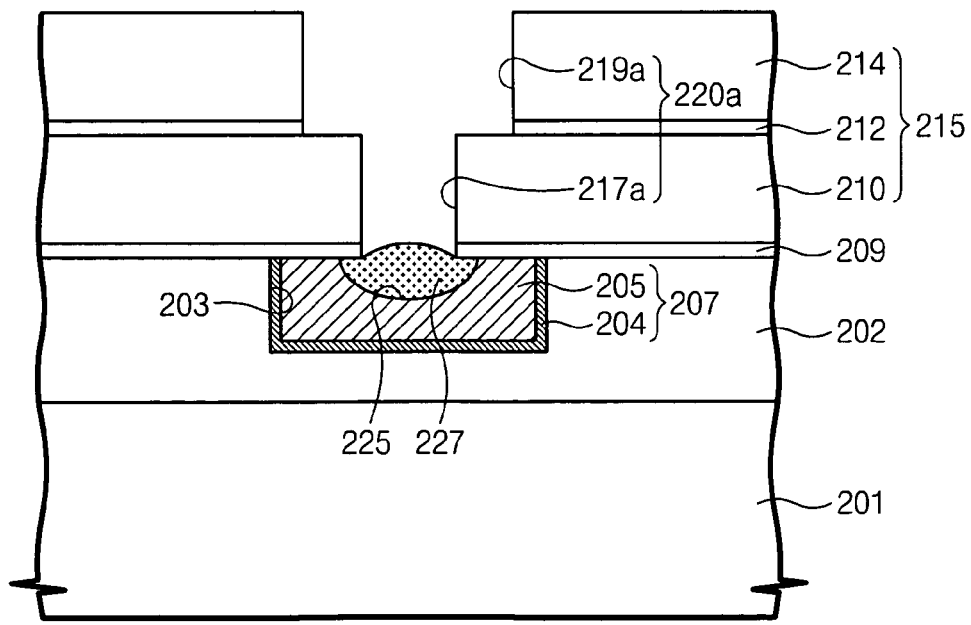

A high-resistance compound 223 may be formed at a portion of the lower interconnection 207 exposed by the intaglio pattern 220a, Referring to FIG. 12, the high-resistance compound 223 is removed by a post-treatment process at the semiconductor substrate 201 including the intaglio pattern 220a to form a concave region 225 on the top surface of the exposed lower interconnection 207. The edge of the concave region 225 may be placed under the capping layer 209. Preferably, the post-treatment process is an isotropic etching process. A liquid chemical used in the post-treatment process preferably etches the high-resistance compound faster than the mold layer 215. For example, the post-treatment process may be performed using at least one selected from the group consisting of a liquid chemical including tetra-methyl-ammonium-hydroxide (TMAH), a liquid chemical including chlorine, a liquid chemical including a carboxyl group and a liquid chemical including ascorbic acid.

The embedding conductive layer 227 is formed to fill the concave region 225. The top surface of the embedding conductive layer 227 is formed at least as high as the height of the flat top surface of the bottom interconnection 207. A portion of the embedding conductive layer 227 may fill a portion of the contact hole 217a. Preferably, the embedding conductive layer 227 is formed using an electroless plating method. The embedding conductive layer 227 may be formed in the same manner as that described for previous embodiments of the present invention. Accordingly, the embedding conductive layer 227 can sufficiently fill the edges of the concave region 225 or selectively fill only the concave region 225. Preferably, the embedding conductive layer 227 may be formed of one selected from the group consisting of copper, nickel, cobalt and palladium.

Figure 13:
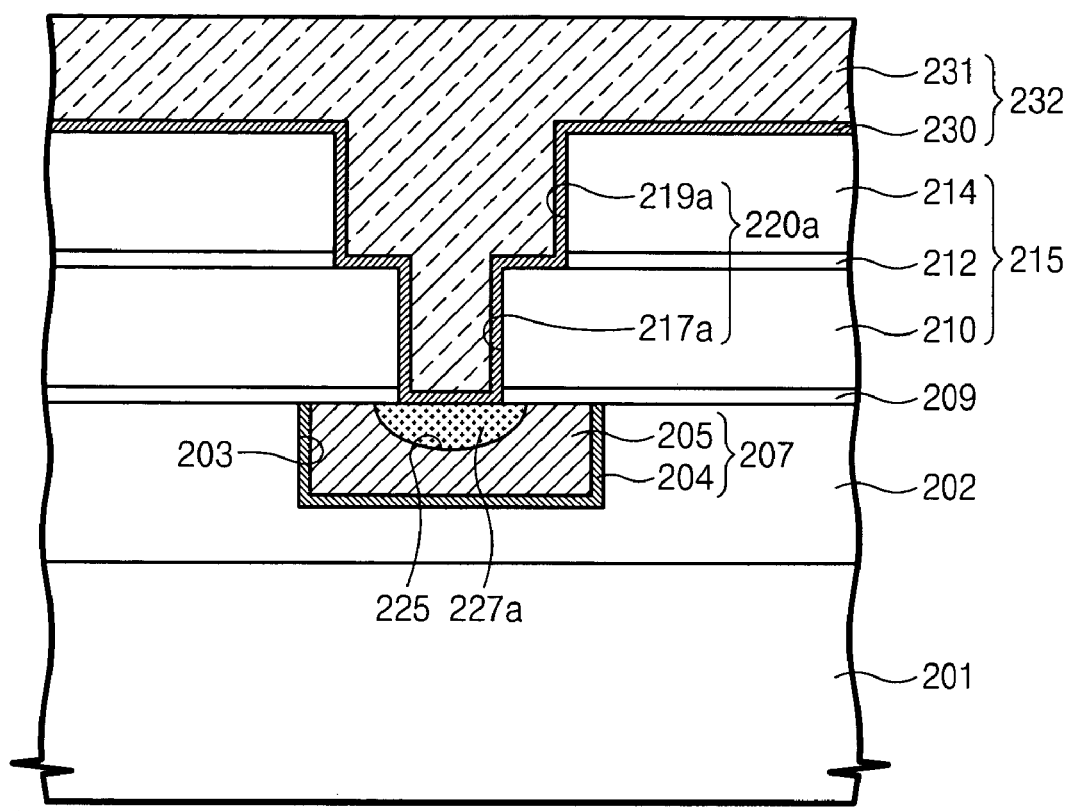

Referring to FIG. 13, the top surface of the embedding conductive layer 227 is planarized by a recessing process at the semiconductor substrate 201 to form a recessed embedding conductive layer 227a. The top surface of the recessed embedding conductive layer 227a may be formed at least as high as the height of the flat portion of the lower interconnection 207. In other words, the recessed embedding conductive layer 227a completely fills the concave region 225. The recessing process can be carried out using, for example, an RF (radio frequency) plasma etching process. In other embodiments of the present invention, the recessing process can be omitted.

A conductive layer 232 filling the intaglio pattern 220a is formed on the entire surface of the semiconductor substrate 201 including the recessed embedding conductive layer 227a. The conductive layer 232 may include a second barrier layer 230 and a second metal layer 231, which are stacked. The second barrier layer 230 is conformally formed on the entire surface of the semiconductor substrate 201 including the recessed embedding conductive layer 227a, and the second metal layer 231 is formed to fill the intaglio pattern 220a on the second barrier layer 230. The second barrier layer 230 may be formed of a conductive layer preventing metal elements in the second metal layer 231 from diffusing into the mold layer 215. The second barrier layer 230 may be made of, for example, TiN, Ti/TiN, TaN or Ta/TaN, and the second metal layer 231 may be made of, for example, copper or aluminum.

The conductive layer 232 is planarized until the top surface of the mold layer 215 is exposed to form an upper conductive pattern, such as the upper conductive pattern 232a of FIG. 9. The upper conductive pattern 232a includes a second barrier pattern and a second metal pattern, which are stacked.

In the method of fabricating a contact structure according to the present embodiment of the invention, the concave region 225 is completely filled with the embedding conductive layer 227a, thereby preventing the occurrence of voids. Consequently, contact resistance of the contact structure is decreased, and reliability of semiconductor devices having the contact structure is improved.

According to various exemplary embodiments of the present invention, after forming the intaglio pattern exposing a predetermined region of the lower interconnection, the concave region is formed by a post-treatment process. The embedding conductive layer is formed to fill the concave region and the upper conductive pattern is formed in the intaglio pattern. As a result, the concave region completely fills the embedding conductive layer to prevent voids from occurring. Consequently, contact resistance of the contact structure is decreased, and reliability of semiconductor devices having the contact structure is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A contact structure of a semiconductor device comprising:
   a lower conductive pattern arranged at a predetermined region of a semiconductor substrate;
   a concave region formed at a predetermined region of a top surface of the lower conductive pattern;
   an embedding conductive layer filling the concave region, a top surface of the embedding conductive layer placed at least as high as the height of the top surface of the lower conductive pattern;
   a mold layer covering the semiconductor substrate, the lower conductive pattern and the embedding conductive layer;
   an intaglio pattern disposed in the mold layer to expose a predetermined region of the embedding conductive layer; and
   an upper conductive pattern filled in the intaglio pattern.

2. The contact structure of claim 1, wherein the embedding conductive layer is composed of metals formed by an electroless plating method.

3. The contact structure of claim 1, wherein the embedding conductive layer is made of at least one metal selected from the group consisting of copper, cobalt, palladium and nickel.

4. The contact structure of claim 1, further comprising a capping layer disposed between the mold layer and the lower conductive pattern.

5. The contact structure of claim 1, wherein the upper conductive pattern comprises:
   a barrier pattern conformally formed on inner sidewalls of the intaglio pattern and on top of the exposed embedding conductive layer; and
   a metal pattern filling the intaglio pattern on the barrier pattern.

6. The contact structure of claim 1, wherein the upper conductive pattern is filled in a contact hole that penetrates the mold layer to expose the predetermined region of the embedding conductive layer, the intaglio pattern comprising the contact hole.

7. The contact structure of the semiconductor device of claim 1, wherein the mold layer includes a first interlayer dielectric and a second interlayer dielectric, the first interlayer dielectric and the second interlayer dielectric are stacked, the upper conductive pattern fills a contact hole and a groove,
   the contact hole penetrates the first interlayer dielectric to expose a predetermined region of the embedding conductive layer, the groove is in communication with the contact hole in the second interlayer dielectric, and the intaglio pattern comprises the contact hole and the groove.

8. The contact structure of the semiconductor device of claim 7, further comprising an etch stop layer disposed between the first and second interlayer dielectrics, wherein the groove is formed in the second interlayer dielectric and the etch stop layer.

* * * * *